United States Patent

Otto et al.

Patent Number: 5,885,938
Date of Patent: *Mar. 23, 1999

[54] LOW-ASPECT RATIO SUPERCONDUCTOR WIRE

[75] Inventors: Alexander Otto, Chelmsford; Craig J. Christopherson, South Grafton, both of Mass.

[73] Assignee: American Superconductor Corporation, Westborough, Mass.

[*] Notice: This patent issued on a continued prosecution application filed under 37 CFR 1.53(d), and is subject to the twenty year patent term provisions of 35 U.S.C. 154(a)(2).

[21] Appl. No.: 554,693

[22] Filed: Nov. 7, 1995

[51] Int. Cl.$^6$ ................................................ H01L 39/24
[52] U.S. Cl. .......................... 505/431; 29/599; 505/433; 505/928
[58] Field of Search .............................. 29/599; 505/430, 505/431, 433, 928, 929, 930

[56] References Cited

U.S. PATENT DOCUMENTS 5,068,219  11/1991  Hagino et al. .................... 29/599 X

FOREIGN PATENT DOCUMENTS

| 0296 477 | 12/1988 | European Pat. Off. |
| 0 612 113 A2 | 8/1994 | European Pat. Off. |
| 503525 | 3/1992 | Germany . |
| 2 259 032 | 3/1993 | United Kingdom . |

OTHER PUBLICATIONS

EP 96 30 7753, European Search Report dated Feb. 28, 1997.

Otto et al., "Progress Towards a Long Length Metallic Precursor Process for Multifilament Bi–2223 Composite Superconductors", IEEE Transactions of Applied Superconductivity, vol. 5, No. 2, Jun. 1995, pp. 1154–1157.

Otto et al., "Properties of High–$T_c$ Wires Made by the Metallic Precursor Process", JOM, vol. 45, No. 9, Sep. 1993, pp. 48–52.

Primary Examiner—Joseph M. Gorski
Attorney, Agent, or Firm—Fish & Richardson P.C.

[57] ABSTRACT

A low-aspect ratio multi-filament superconductor wire includes a plurality of oxide superconductor filaments arranged in an elongated wire structure. Each filament of the wire also has a low-aspect ratio. The filaments are textured such that a crystallographic c direction of each filament is aligned with a crystallographic c direction of all other filaments with the crystallographic c directions being perpendicular to the longitudinal axis of the wire structure. The invention also features a groove rolling machine for forming a low-aspect ratio multi-filament superconductor wire by texturing a precursor tape by deforming the tape to a low-aspect ratio wire by reducing a larger dimension of the tape in such a way as to prevent buckling of the tape. A superconducting cable can be formed by planetary winding a plurality of multi-filament superconductor wires.

8 Claims, 4 Drawing Sheets

LOW-ASPECT RATIO SUPERCONDUCTOR WIRE

BACKGROUND OF THE INVENTION

The geometries in which high-performance superconducting oxide composites may be successfully fabricated are constrained by the necessity of texturing the material to achieve adequate critical current density. The current-carrying capacity of a superconducting oxide composite depends significantly on the degree of crystallographic alignment and intergrain bonding of the oxide grains, together known as "texturing", induced during the composite manufacturing operation.

Known processing methods for texturing superconducting oxide composite articles include various forms of heat treatment as well as longitudinal deformation. Certain superconducting oxide grains can be oriented along the direction of an applied strain, a phenomenon known as deformation-induced texturing (DIT). Longitudinal deformation techniques like pressing, drawing and rolling have been used to induce grain alignment of the oxide superconductor c-axis perpendicular to the plane or direction of elongation. Heat treatment under conditions which at least partially melt and regrow desired superconducting phases may promote texturing by enhancing the anisotropic growth of the superconducting grains, a phenomenon known as reaction-induced texturing (RIT).

However, not all texturing methods are equally applicable to, or effective for, all superconducting oxides. Most of these materials have very few known effective texturing mechanisms. For example, known techniques for texturing the two-layer and three-layer phases of the bismuth-strontium-calcium-copper-oxide family of superconductors (BSCCO 2212 and BSCCO 2223, respectively) are described in Tenbrink, Wilhelm, Heine and Krauth, Development of Technical High-Tc Superconductor Wires and Tapes, Paper MF-1, Applied Superconductivity Conference, Chicago (Aug. 23–28, 1992), and Motowidlo, Galinski, Hoehn, Jr. and Haldar, Mechanical and Electrical Properties of BSCCO Multifilament Tape Conductors, paper presented at Materials research Society Meeting, Apr. 12–15, 1993. Techniques for manufacturing multifilamentary articles with sufficient texturing to provide acceptable critical current densities from BSCCO 2223 are presently limited to the production of highly aspected forms such as tapes.

The effectiveness of a particular DIT technique will depend on how closely the applied strain vectors correspond to the slip planes in the superconducting oxide. Thus, superconducting oxides such as the BSCCO family, which have a micaceous structure characterized by highly anisotropic preferred cleavage planes and slip systems, are known to be most effectively DIT textured by non-axisymmetric techniques such as pressing and rolling, which create highly aspected (greater than about 5:1) forms. For perovskite structures like the 123 phase of the yttrium-barium-copper-oxide (YBCO) family, which lack preferred cleavage planes and slip systems, longitudinal deformation is generally less effective in improving critical current density and the differences in texturing obtainable by axisymmetric and non-axisymmetric techniques are less pronounced.

Materials which exhibit peritectic melting can be effectively textured in a variety of geometries by melt textured growth, an RIT technique. Peritectic decomposition and the reformation of the oxide superconductor from the liquid +(other) solid phase is the basis for melt textured growth of the two-layer phases of the bismuth-strontium-calcium-copper-oxide family of superconductors (BSCCO-2212) in round wire and tape forms, as described, for example, in Kase et al. IEEE Transmag 27(2), 1254 (March 1991). Because 2212 totally melts and reforms during melt-textured growth, the texturing induced by deformation prior to the melting will not influence the final structure.

However, some of the most promising superconducting oxides, such as BSCCO 2223, cannot be effectively textured by the melt-textured growth technique. Instead of peritectic melting, BSCCO 2223 exhibits irreversible melting in that solid 2223 does not form directly from a liquid of 2223 composition. RIT techniques applicable to BSCCO 2223 have been described, for example in U.S. patent application Ser. No. 08/041,822 filed Apr. 1, 1993, entitled IMPROVED PROCESSING OF OXIDE SUPERCONDUCTORS, and Ser. No. 08/198,912 filed Feb. 17, 1994, entitled IMPROVED PROCESSING OF OXIDE SUPERCONDUCTORS. The basis of such techniques is some type of partial melting, such as eutectic melting, solid solution melting or formation of non-equilibrium liquids, in which the oxide superconductor coexists with a liquid phase rather than being totally decomposed. However, such techniques are inherently more dependent on the geometry of the initial phase than melt-textured growth, and texturing induced by deformation prior to the partial melting will have a significant impact on the texturing of the final product. The RIT technique described in U.S. patent application Ser. No. 08/041,822 cited above, for example, has been observed to provide the greatest improvement in the $J_c$'s of BSCCO 2223 samples when used in combination with a highly non-axisymmetric DIT technique, rolling. In short, superconducting oxides with irreversible melting characteristics such as BSCCO 2223 can be adequately textured by known techniques in highly aspected forms such as tapes, but scalable methods for manufacturing round wires and other low aspect ratio composite multifilamentary articles with sufficient texturing to provide acceptable critical current densities are not presently available.

This limitation has considerable significance. Many of the superconductor applications that have the greatest potential for energy conservation involve operating the superconductor in the presence of an AC magnetic field, or require that the superconductor carry an AC current. In the presence of time-varying magnetic fields or currents, there are a variety of mechanisms that give rise to energy dissipation, hereafter called AC losses, even in superconductors. Thus, the superconductor geometry must be selected to reduce AC losses, in order to preserve the intrinsic advantage of superconductors, the absence of DC electrical resistance. The physics governing AC losses in low temperature superconducting composite materials have been described and analyzed, C. F., Wilson, Superconducting Magnets, Ch 8 (1983, 1990), and round, multifilamentary composite geometries with twisted, low aspect ratio superconducting filaments have been demonstrated to have significantly better AC loss characteristics than highly aspected, untwisted or monofilamentary forms. To minimize hysteretic losses, the superconductor must preferably be subdivided into many small filaments that are dimensionally uniform and discrete along the length of the conductor. Low aspect ratio filaments (about 4:1 or less) will have lower hysteretic losses in all but unidirectional magnetic fields, so these filament dimensions are generally preferred. To minimize eddy current losses, the matrix resistivity must preferably be increased and the twist pitch of the filaments must preferably be tightened, i.e., reduced.

SUMMARY OF THE INVENTION

The invention relates to a low-aspect ratio multi-filament superconductor wire. The invention features a multifilament superconductor wire including a plurality of oxide superconductor filaments arranged in an elongated wire structure. The wire structure features a low-aspect ratio in a plane transverse to a longitudinal axis of the wire structure and the low-aspect ratio shape is preserved along a working length of the wire. Each filament of the wire follows a longitudinal axis that is substantially parallel to the wire axis and also has a low-aspect ratio in a plane transverse to the longitudinal axis with the low-aspect ratio being preserved along the working length of the wire. The filaments are textured such that a crystallographic c direction of each filament is aligned with a crystallographic c direction of all other filaments with the crystallographic c directions being perpendicular to the longitudinal axis of the wire structure.

In particular embodiments of the invention, the oxide superconductor comprises a micaceous oxide. The micaceous oxide is a BSCCO oxide. The plurality of filaments is in the range of 2 to $10^6$ filaments and the wire includes a high resistance wire surface coating with an average resistivity of $10^{-2}$ to $10^{-5}$ $\Omega$-cm.

The multi-filament superconductor wire is capable of carrying current at a density in the range of at least 500 to 5,000 A/cm$^2$ at a temperature of at least 20 Kelvin. The wire also carries this current density in an AC RMS magnetic field of at least 0.05 Tesla directed orthogonally to the c direction.

According to another aspect of the invention, a single oxide superconductor filament wire is arranged in an elongated wire structure. The wire structure has a low-aspect ratio shape in a plane transverse to a longitudinal axis of the wire structure and the low-aspect ratio is preserved along a working length of the wire. The filament follows a longitudinal axis substantially parallel to the wire axis and has a low-aspect ratio in a plane transverse to the longitudinal axis. The low-aspect ratio of the filament is preserved along the working length of the wire. The filament is textured such that a crystallographic c direction of the filament is perpendicular to the longitudinal axis of the wire structure.

In particular embodiments of the invention, the single oxide superconductor filament wire includes a high resistance wire surface coating with an average resistivity of $10^{-2}$ to $10^{-5}$ $\Omega$-cm.

According to another aspect of the invention, a low-aspect ratio multi-filament superconductor wire has $J_c$ anisotropy with respect to two orthogonal magnetic field orientations perpendicular to the longitudinal axis of the wire structure in a 0.2 Tesla field DC at 77 Kelvin in the range of at least 2:1 to 4:1.

According to another aspect of the invention, a low-aspect ratio multi-filament superconductor wire is capable of carrying a current density in the range of at least 1000 to 25000 A/cm$^2$ at 77 Kelvin. The multi-filament superconductor wire has a cross-sectional area in the range of 0.000025 cm$^2$ to 0.12 cm$^2$.

According to another aspect of the invention, a method of making a multi-filament superconductor wire includes producing a multi-filament count precursor tape including filaments of superconducting metallic-alloy precursors in intimate contact with a noble metal matrix, oxidizing the filaments, reacting the precursor oxide filaments by thermal treatment, texturing the thermally treated precursor tape by deforming the tape to a wire having a low-aspect ratio in a plane transverse to a longitudinal axis of the wire by reducing a larger dimension of the tape in such a way as to prevent buckling of the tape, and reacting the textured wire. The method preserves the low-aspect ratio of the wire along a working length of the wire, and each filament follows a longitudinal axis substantially parallel to the wire axis and has a low-aspect ratio in a plane transverse to the longitudinal axis, the low-aspect ratio of each filament being preserved along the working length of the wire.

In one particular embodiment of the invention, the step of producing a multi-filament count precursor tape includes extruding a round multi-filament wire, twisting the round wire and hot rolling the round wire to a tape.

According to another aspect of the invention, the method of making a multi-filament superconductor wire includes producing a multi-filament count precursor tape comprising filaments of superconducting oxide precursors in intimate contact with a noble metal matrix and the tape is produced by extruding a round multi-filament wire, twisting the round wire and room temperature drawing or rolling the round wire to a tape.

According to another aspect of the invention, a groove rolling machine for deforming superconductor precursor tape includes a first groove roll including a first groove assembly comprising a central ridge located between two ring grooves, the ring grooves having diameters less than a diameter of the central ridge and the central ridge and the ring grooves being aligned to rotate about a common axis. A second groove roll includes a second groove assembly comprising a central ridge aligned to rotate about a second axis, and free-floating constraining rings located on either side of the second groove roll central ridge, the constraining rings having diameters greater than a diameter of the second groove roll central ridge and aligned to rotate about a third axis parallel to and offset from the second axis. The common, second and third axes defines an alignment plane with the first groove roll central ridge and the second groove roll central ridge being substantially aligned in a plane transverse to the alignment plane. The groove rolls are constructed and arranged for relative motion along the alignment plane.

In particular embodiment of this aspect of the invention, the constraining rings are suitably arranged to facilitate removal of the superconductor precursor tape from the groove rolling machine after the tape has been deformed. The diameter of the second groove roll central ridge is substantially equivalent to the diameter of the first groove roll central ridge. A biasing element is included for exerting a force in a radially outward direction on the constraining rings to help maintain an offset between the third axis and the second axis in a direction away from the common axis. The ring grooves include a reinforcing section to strengthen the central ridge and the constraining rings include a corresponding reinforcing section. The first groove roll central ridge and the ring grooves are integral with the first groove roll. The first and second groove roll central ridges are free-floating.

According to another aspect of the invention, an amalgamated superconducting wire is formed by planetary winding a plurality of low-aspect ratio multi-filament superconductor wires. Each multi-filament superconductor wire has in the range of about 2 to 100 oxide superconductor filaments. The amalgamated wire exhibits low AC coupling losses between the multi-filament superconductor wires.

According to another aspect of the invention, an amalgamated superconducting wire is formed by planetary winding a plurality of low-aspect ratio, single oxide superconductor filament wires. The amalgamated wire exhibits low AC coupling losses between multi-filament wires.

According to another aspect of the invention, a superconducting cable includes a plurality of low-aspect ratio multifilament superconductor wires wound in a planetary winding. Each multi-filament superconductor wire has in the range of about $10^2$ to $10^6$ filaments. The superconducting cable is formed into a magnetic coil for operation in an AC magnetic field.

BRIEF DESCRIPTION OF THE DRAWINGS

Other objects, features and advantages of the invention will be apparent from the following description taken together with the drawings in which.

DESCRIPTION OF THE PREFERRED EMBODIMENT

Figure 1:
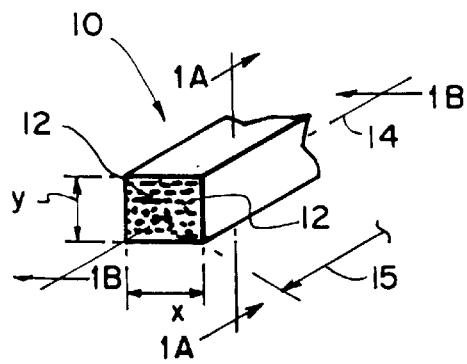
FIG. 1 is a diagrammatic representation of the low-aspect ratio multi-filament superconductor wire of the invention.
Figure 1C:
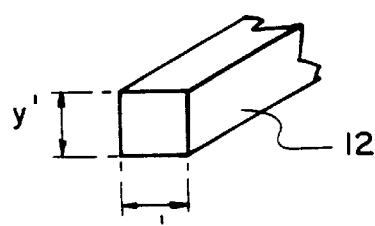
FIG. 1C is a diagrammatic representation of a low-aspect filament of the of the multi-filament superconductor wire of FIG. 1.
Figure 1A:
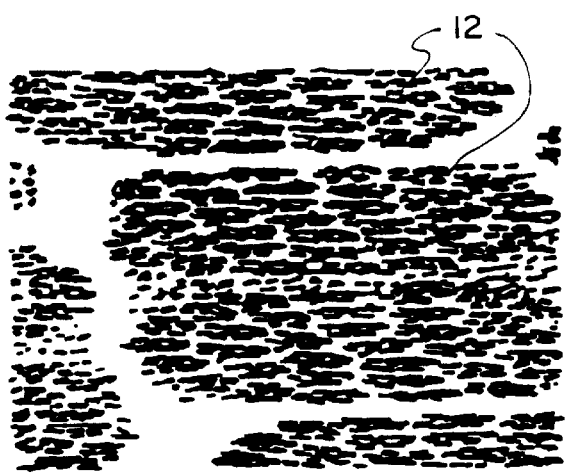
FIG. 1A is a partial cut-away view of the low-aspect ratio multi-filament superconductor wire of the invention taken along line 1A—1A in FIG. 1.
Figure 1B:
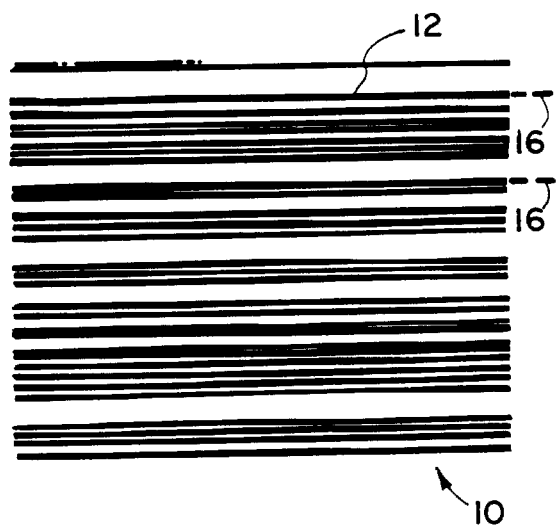
FIG. 1B is a partial cut-away view of the low-aspect ratio multi-filament superconductor wire of the invention taken along line 1B—1B in FIG. 1.

As seen in FIGS. 1–1B, a low-aspect ratio multi-filament superconductor wire 10 according to the invention has a width x and a height y with an aspect ratio, x/y, in the range of about 4 to 0.8, and preferably about 1.0, in a plane transverse to a longitudinal axis 14 of the wire 10. For example, width x of wire 10 may be in the range of about 0.01 cm to 0.3 cm, preferably about 0.05 cm to 0.15 cm, height y in the range of about 0.0025 cm to 0.4 cm, preferably about 0.0125 cm to 0.2 cm, and the cross-sectional area of wire 10 in the range of about 0.000025 cm$^2$ to 0.12 cm$^2$, preferably about 0.0006 cm$^2$ to 0.03 cm$^2$.

Referring particularly to FIGS. 1B and 1C, superconductor wire 10 includes a plurality of micaceous superconducting oxide containing low-aspect ratio filaments 12, each following a longitudinal axis 16 substantially parallel to wire longitudinal axis 14. Each low-aspect ratio filament 12 has a width x' and a height y' with an average aspect ratio, x'/y', corresponding to that of wire 10, in a plane transverse to the longitudinal axis 14 of wire 10. For example, width x' and height y' of filament 12 may be in the range of about 0.5 to 70 microns, preferably width x' is in the range of about 8 to 30 microns and height y' is in the range of about 2 to 38 microns. The number of filaments 12, in this embodiment, is generally in the range of $10^2$ to $10^6$, and may be as low as 2 filaments.

Figure 2:
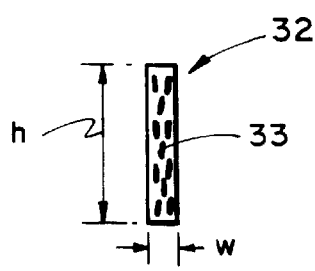
FIG. 2 is a diagrammatic representation of the precursor tape.

Low-aspect ratio superconductor wire 10 is formed from a precursor superconductor multi-filament tape 32 (FIG. 2) including high-aspect ratio filaments 33. A novel process for texturing tape 32 to form low-aspect ratio wire 10, described below, protects the filaments from damage due to shearing or buckling.

Figure 2A:
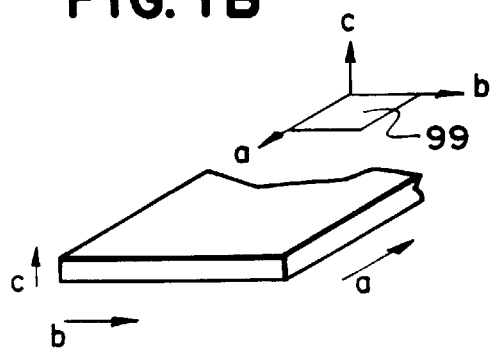
FIG. 2A is a diagrammatic representation of a superconducting grain.

Texturing processes produce crystallographic alignment and intergrain bonding of the grains of the superconducting oxide or its precursors. Referring to FIG. 2A, there exists an anisotropy in superconducting properties with the greatest supercurrent flowing in the directions lying in the crystallographic c planes 99, the plane containing the a and b direction vectors, of the superconducting oxide grains. Thus it is desirable to orient the superconducting oxide grains such that the crystallographic c directions of each filament are aligned (and thus the crystallographic c planes are aligned). The crystallographic c planes may then be aligned with the operationally-required direction of current flow to provide the greatest current flow. Texturing of precursor tape 32, as described below, aligns the crystallographic c directions of the grains in each filament such that each filament 12 has a crystallographic c or "bad" direction with respect to superconducting properties aligned with the crystallographic c directions of all other filaments. The texturing, according to the invention, produces a wire 10 having a known "bad" direction along height y and a known "good" direction along the c plane; the useful "good" direction being along width w.

Precursor superconductor multi-filament tape 32 may be formed according to the metallic precursor (MP) process as described in Progress Towards a Long Length Metallic Precursor Process for Multifilament Bi-2223 Composite Superconductors by Otto et al., *IEEE Transactions on Applied Superconductivity*, Vol. 5, No. 2, June 1995, the contents of which are incorporated by reference, in their entirety, herein. Briefly, for a Bi-2223 oxide/silver composite superconductor, powder elements (Bi, Pb, Sr, Ca, Cu and Ag) are mixed together according to known mechanical alloying processes. High filament count precursor tape 32, for example, referring to FIG. 2, a 9583 count filament tape of 0.056 cm width w and 0.51 cm height h, is produced by repeated extrusion of the precursor alloy powder packed in a silver can, followed by oxidation and then reaction by thermal treatments to form Bi-2212 superconducting oxide grains and "0011" reactant.

The Bi-2212 in precursor tape 32 is then crystallographically textured by deformation at strains that are approximately ¹⁄₁₀₀₀th of the strain required to fabricate the 9583-filament precursor tape. To produce the low-aspect ratio superconductor wire 10 of the invention, crystallographic texturing of the Bi-2212 is accomplished by deforming tape 32 to a low-aspect ratio wire 34 (FIG. 3A) including low-aspect ratio filaments without subjecting filaments 33 to damaging shear and buckling forces, as described below. After texturing, wire 10 is produced by reacting wire 34 to form Bi-2223.

Precursor superconductor multi-filament tape 32 may also be formed by the "oxide-powder-in-tube" method as described in K. H. Sandhage, *Critical Issues in the OPIT Processing of High $J_c$ BSCCO Superconductors,* Journal of Metals, Vol. 43 (March 1991), pp. 21–25, the contents of which are incorporated by reference, in their entirety, herein. In this method, superconducting oxide powder is used instead of precursor alloy powder.

The invention is applicable to any desired superconducting oxide which is in itself micaceous or semi-micaceous, or which has micaceous or semi-micaceous precursors. A micaceous structure is characterized by highly anisotropic preferred cleavage planes and slip systems. Semi-micaceous structures are characterized by a highly anisotropic, plate-like structure but poorly defined cleavage planes and slip systems. The BSCCO family of oxide superconductors are examples of micaceous forms, and the YBCO family, and the TBSCCO family of oxide superconductors and the HBSCCO family of oxide superconductors are examples of semi-micaceous structures. Micaceous or semi-micaceous precursors of a desired oxide superconductor may also be used, such as BSCCO 2212 precursors, which are micaceous, when the desired oxide superconductor is BSCCO 2223.

Figures 3, 3A:
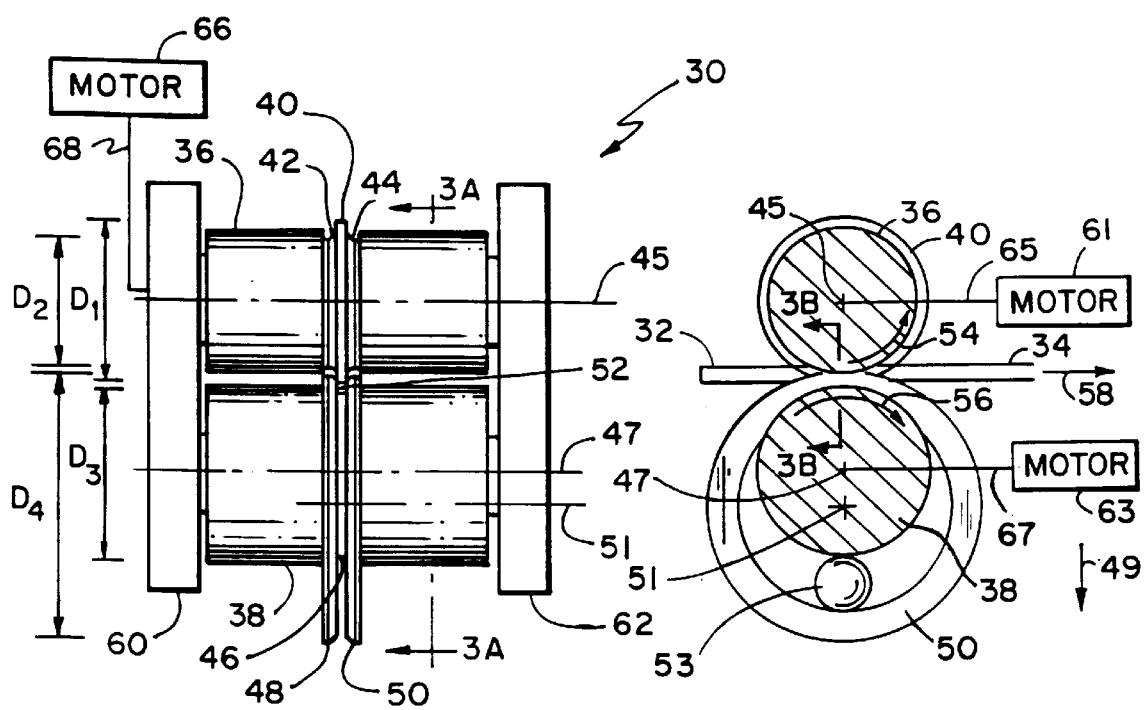
FIG. 3 is a diagrammatic representation of the groove rolling machine of the invention.
FIG. 3A is a cross-sectional view taken along line 3A—3A of FIG. 3.
Figures 3B, 3C:
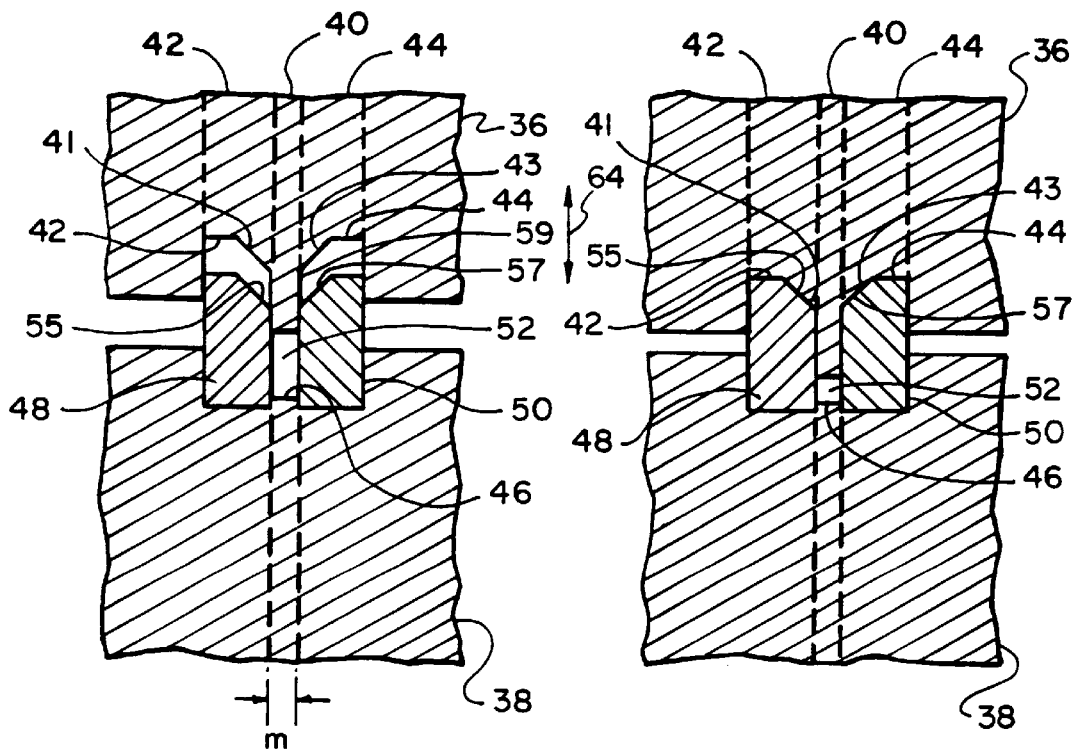
FIG. 3B is an enlarged cross-sectional view taken along line 3B—3B of FIG. 3A showing the groove rolling machine in an intermediate step in the groove rolling process.
FIG. 3C is an enlarged cross-sectional view similar to that of FIG. 3B showing the groove rolling machine in the final step of the groove rolling process.

Referring to FIGS. 3–3B, a novel groove rolling machine 30 has been developed to deform superconductor precursor tape 32 into low-aspect ratio wire 34 without subjecting the filaments to damaging shear and buckling loads which would decrease the current carrying densities which are otherwise achievable. During the deformation process, high-aspect ratio filaments 33 are deformed to low-aspect ratio filaments 12.

Groove rolling machine 30 includes a first groove roll 36 and a second groove roll 38. First groove roll 36 includes a central ridge 40 located between two ring grooves 42, 44. The diameter D1 of central ridge 40 is about 0.01 to 10 cm, preferably about 0.05 to 2 cm, preferably about 0.05 to 0.5 cm, and most preferably about 0.2 cm, greater than the diameter D2 of ring grooves 42, 44. Central ridge 40 and ring grooves 42, 44 rotate about a common axis 45. Referring particularly to FIG. 3B, ring grooves 42, 44 include reinforcing sections 41, 43 to strengthen portion 59 of central ridge 40.

Second groove roll 38 includes a central ridge 46 located between two free-floating constraining rings 48, 50. The diameter D3 of central ridge 46 is generally substantially equal to diameter D1 of central ridge 40 to present a common surface to tape 32 so the work hardening and strain are the same on both sides of the tape. Diameter D3 of central ridge 46 is generally at least about 10 percent less than the diameter D4 of constraining rings 48, 40. The choice of diameters D1 and D3 of central ridges 40, 46 effects the shear on tape 32 during deformation, the larger the diameter the less shear. It may be advantageous to initially use diameters on the low side of the range to aid in breaking-up the oxide grains and then change to a larger diameter as deformation proceeds via multiple passes.

Central ridge 46 rotates about an axis 47 and constraining rings 48, 50 rotate about an axis 51, parallel to and offset, for example, vertically offset, from axis 47. Constraining rings 48, 50 include reinforcing sections 55, 57 for mating with reinforcing sections 41, 43 respectively of ring groves 42, 44. Groove rolling machine 30 may include a biasing element, e.g. a spring loaded wheel 53, which exerts a force in the radial direction (arrow 49) on the free-floating constraining rings 48, 50 to help offset axis 51 from axis 47. Constraining rings 48, 50 act to both provide side support to precursor tape 32 during deformation and to facilitate the removal of the resulting low-aspect ratio wire 34 from groove rolling machine 30.

In the illustrated embodiment, axes 45, 47 and 51 all lie in a common plane with central ridges 40, 46 horizontally aligned. Groove rolls 36 and 38 are mounted in supports 60, 62 both for rotation about their respective axes and for relative motion along the common plane (arrow 64). In the illustrated embodiment, motors 61, 63 and drives 65, 67 are shown driving groove rolls 36, 38, and motor 66 and drive 68 are shown for producing relative motion along the common plane.

Dimension m of an opening 52 between central ridges 40, 46 corresponds to the width w of precursor tape 32 (and the dimension x of superconductor wire 10) and dimension n of opening 52 can be adjusted by moving groove roll 36 along arrow 64. Upper and lower groove rolls 36, 38 may include a number of central ridges 40, 46, ring grooves 42, 44 and constraining rings 48, 50 dimensioned to give a selection of different sized openings 52. Ring grooves 42, 44 and central ridges 40, 46 are preferably machined as integral components of upper and lower groove rolls 36, 38. Alternatively, central ridges 40, 46 can be a free-floating ring for ease of replacement when worn and to change the dimensions of opening 52.

Lubrication, for example, solid, dry or liquid lubricants, including graphite, molybdenum disulfide, organic or inorganic oils, suspensions in liquid, slurries, may be advantageously used to more uniformly transmit strain from the groove rolls into the wire during deformation and prevent sticking onto the groove rolls. The surfaces of the groove rolls defining opening 53 preferably have a surface finish less than 24 microinches, and most preferably less than 5 microinches, although occasionally other preferred geometric textures may be employed.

During groove rolling, with groove rolls 36, 38 positioned such that dimension n of opening 52 is a desired fraction of the height h of precursor tape 32, precursor tape 32 is fed into opening 52. Constraining rings 48, 50 provide support to precursor tape 32 in the region of opening 52 to prevent buckling and shear of precursor tape 32 during rolling. Referring particularly to FIG. 3*a,* groove roll 36 is driven to rotate counterclockwise (arrow 54) while groove roll 38 is driven to rotate clockwise (arrow 56) feeding precursor tape 32 through opening 52. As the newly formed tape 34 exits the region of opening 52 along arrow 58, constraining rings 48, 50 flex outward slightly to discharge wire 34 from groove rolling machine 30. This flexing action facilitates the release of the compacted tape from opening 52 by providing a larger volume than opening 52 for the tape to slightly expand into as the turning groove rolls force the tape through the opening.

The tape is repeatedly fed back and forth through the groove rolling machine with the groove rolls repositioned and locked in position before each pass to decrease dimension n by about 5 to 85%, preferably about 5 to 20%, most preferably about 9%, until dimension n corresponds to the desired resulting dimension y of superconductor wire 10. It has been found that feeding the tape back and forth over a number of passes aligns a larger fraction of the grains than feeding the tape in the same direction each pass. During the groove rolling process, filaments 12 become elongated and decrease in height while substantially maintaining their width such that tape 32 becomes elongated, decreases in height h and substantially maintains width w.

During the groove rolling process the crystallographic c or "bad" direction of the superconductor grains in each filament are substantially aligned. The deformation produces low-aspect ratio filaments having their crystallographic c directions substantially aligned along the height dimension of low-aspect ratio wire 34. Wire 34 is then reacted to form wire 10.

The groove rolling process may be preformed at room temperature or advantageously at elevated temperatures up to about 830° C. The elevated temperature increases the ductility of the precursor wire, enabling larger reductions in dimension w in each pass without breaking. Additionally, initial groove rolling at cryogenic temperatures down to about 70 Kelvin can be advantageous. At the cryogenic temperatures, the metal matrix around the filaments is hardened, and the stress to deform the matrix increases which transfers more stress into the filaments resulting in more uniform initial deformation. This may then be followed with further deformation at elevated temperature up to about 830° C. If the matrix material includes strengthening agents such as oxide particles, the stress transfer to the filaments is already high and the initial deformation can be preformed at a first elevated temperature followed by further deformation at higher elevated temperature up to about 830° C.

Low-aspect ratio superconductor wire 10 exhibits $J_c$ anisotropy with respect to two orthogonal magnetic field orientations (the first field oriented along width x, the "good" direction, and the second field oriented along height y, the "bad" direction) in a 0.2 Tesla DC field at 77 Kelvin in the range of at least 2:1 to at least 4:1. The magnetic field may be a self-field or an externally applied field. Multi-filament superconductor wire 10 is capable of carrying current at a density of at least 500 A/cm$^2$, preferably at least 2000 to 25000 A/cm$^2$, at a temperature of at least 20 Kelvin in an AC RMS magnetic field of at least 0.05 Tesla directed along the "good" direction.

EXAMPLE

A 1615 filament BSCCO 2223 metallic precursor alloy-silver matrix composite tape was made to a dimension of 0.032" wide (w)×0.15" high (h). It was oxidized by a 500 hour bake in oxygen gas at about 100 atmospheres pressure at 405° C. It was then baked at 830° C. for six minutes in air to form BSCCO 2212 and remaining "0011" reactant and small-strain sheet rolled back to a width of 0.03" to remove any bumps formed during baking, followed by a three minute bake at 830° C. in air. To simulate the groove rolling machine of the invention, slots approximately 0.031" wide by 0.20" deep were machined into 6 inch long aluminum strips. Some slots were sprayed with lubricant (graphite or oil). Tape samples were then inserted on-edge into the slots along with silver spacers to ensure that the slots were completely filled.

The aluminum strips bearing the samples on-edge were then sheet rolled back and forth (hard direction rolled) under strains of 9% per pass to total strip height reduction strains in the 50% to 95% range. At each successive 50% reduction in strain, the samples were annealed at 200° C. for five minutes. Samples were extracted from the strips at progressively higher strains in the 50% to 95% range. These were then reacted according to a standard final reaction sequence. In brief, they were baked for 20 hours at 829° C. in a 7.5% oxygen–92.5% argon gas mixture, roll deformed to a thickness reduction of 20%, followed by a bake consisting of 30 hours at 829° C., 120 hours at 811° C., and 30 hours at 787° C. in 7.5% oxygen–92.5% argon gas mixture, followed by 45 hours at 740° C. in 0.3% oxygen–99.7% argon gas mixture.

The data presented in Table I, illustrates that the hard direction rolled multi-filament samples exhibited a $J_c$ increase with increasing deformation strain. This confirms that hard direction rolling is effective at improving the $J_c$ of BSCCO 2223 in a manner that is similar to conventional flat sheet rolling (see Otto et al., *Properties of High-$T_c$ Wires Made by the Metallic Precursor Process*, JOM vol. 45, No. 9, 48–52), except the product is a low aspect ratio wire (e.g., 1:1 to 4:1 compared to greater than 10:1).

TABLE I $J_c$ dependencies on hard direction rolling strain.

| wire aspect ratio (w:h) | rolling strain (%) | $J_c$ at 77 K (kA/cm$^2$) |
|---|---|---|
| 1:5 | 0 | — |
| 1:2.1 | 58.0 | 0.67 |
| 1:1.3 | 74.7 | 2.77 |
| 1:0.8 | 83.8 | 6.87 |
| 1:0.26 | 94.7 | 7.95 |

The critical current density of the 83.8% strain hard direction rolled wire was measured in magnetic fields applied along the b and c direction vectors at 77K. The results presented in Table II illustrate that the hard direction rolling had imparted a considerable degree of field orientation anisotropy in the measured $J_c$, with the degree of anisotropy increasing with respect to increasing magnetic field.

TABLE II

Magnetic field orientation anisotropy of Jc in a low-aspect ratio 1615 filament Bi-2223 wire

| applied magnetic field (T) | $J_c$ field orientation anisotropy $J_c$ (b,B)/$J_c$(c,B) at 77 K |
|---|---|
| 0 | 1.00 |
| 0.05 | 1.83 |
| 0.10 | 2.08 |
| 0.20 | 2.19 |
| 0.40 | 2.66 |
| 1.00 | 3.13 |

The $J_c$ anisotropy and low-aspect ratio of superconductor wire 10 make it particularly suitable for cabling applications and for coiling. Cabling wires 10 provides for both high current carrying capacity and ductility of the resultant cabled product. In cabling wires 10, crack healing, as described in PCT/US94/03575 filed Apr. 1, 1994 and published Oct. 13, 1994 as WO 94/23459, the contents of which are incorporated by reference, in their entirety, herein, may be advantageously applied.

Figure 4A:
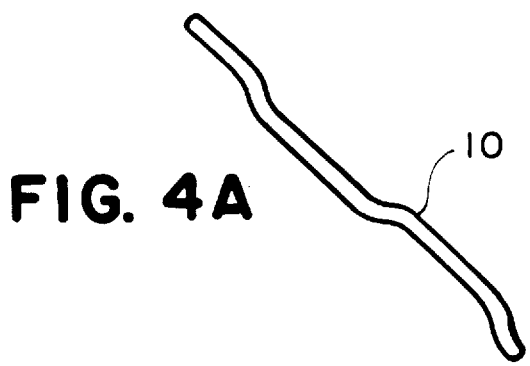
FIG. 4A is a side view of a single wire in the superconductor cable.
Figure 4:
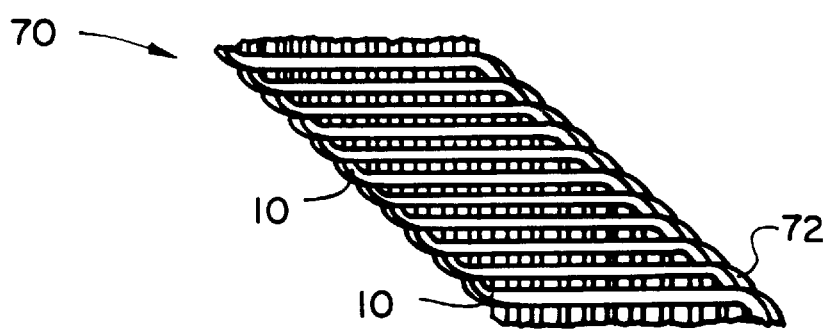
FIG. 4 is a diagrammatic representation of the flat superconductor cable of the invention.
Figure 4B:
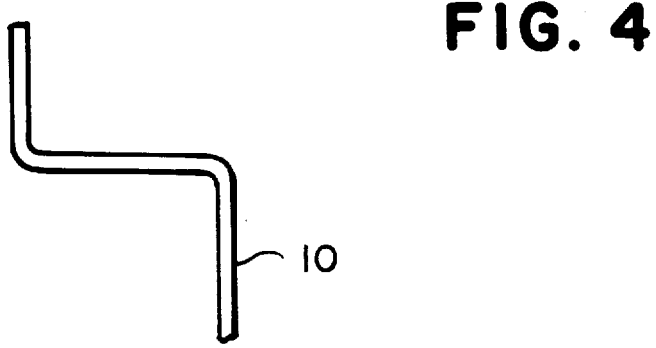
FIG. 4B is a top view of a single wire in the superconductor cable.
Figure 4C:
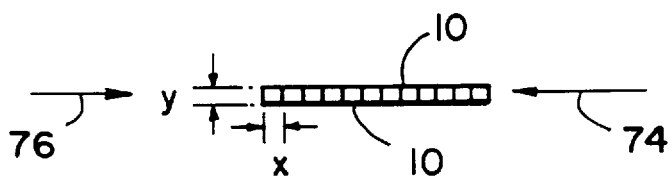
FIG. 4C is a view of the ends of the wires in the superconductor cable.

Referring to FIGS. 4–4C, a plurality of multi-filament superconductor wires 10 may be coated with a relatively high resistance surface coating of 10$^{-2}$ to 10$^{-5}$ $\Omega$-cm and planetary wound to form a flat superconductor cable 70. By planetary winding without rotating the wires at bends 72, a flat cable is produced with the "good" direction of the anisotropic superconducting wires aligned. Referring to FIG. 4C, with the "good" directions aligned, the application of an external magnetic field along the good direction (arrow 74 or arrow 76) produces the highest possible current through cable 70. Alternatively, the application of a flow of electrons through cable 70 produces the highest magnetic field predominantly along the good direction.

A plurality of cables 70 can then be insulated and coiled, maintaining the orientation of the cables, for use in high temperature AC magnet applications. The high current carrying capability of cable 70 lowers the inductance in the AC magnet.

Figure 5:
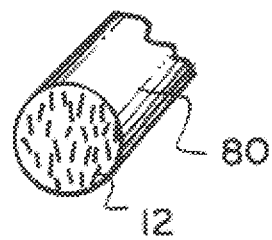
FIG. 5 is a diagrammatic representation of a multi-filament precursor wire.

In order to reduce AC coupling losses between individual filaments in wire 10, the MP process can be modified by performing the final extrusion, before oxidizing the filaments, in a round die to form a round multi-filament precursor wire 80 (FIG. 5). A wire and not a tape is formed at this stage because the wire will maintain its shape when it undergoes subsequent twisting. The round precursor wire is twisted to reduce AC coupling losses between filaments, hot rolled to flatten (without elongation), oxidized and reacted, then grooved rolled to texture. Though the twist pitch length is increased during groove rolling, the overall AC coupling losses can be greatly reduced compared to non-twisted architectures. In the OPIT process, the twisting procedure is similar except hot rolling to flatten is replace by room temperature drawing or rolling.

Figure 6:
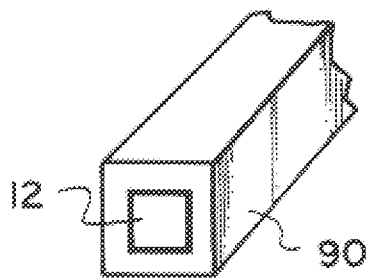
FIG. 6 is a diagrammatic representation of a single-filament low-aspect ratio wire.
Figure 6A:
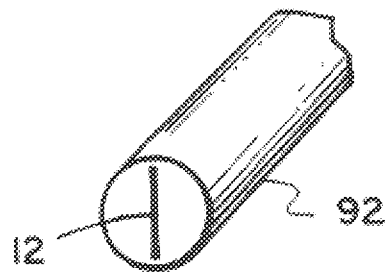
FIG. 6A is a diagrammatic representation of a single-filament precursor wire.
Figure 7:
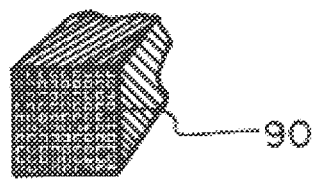
FIG. 7 is a diagrammatic representation of a multi-filament low-aspect ratio superconductor wire formed from a plurality of sub-wires.

Referring to FIGS. 6–6A, in an alternative approach to reducing AC coupling losses between filaments, a modified MP process is used in which a low-aspect ratio sub-wire 90 is produced from a low-filament count (1–100 filaments, preferably 1 filament, 12) precursor wire 92 having a diameter of, for example, about 3–8 mil, preferably about 5 mil, for a single filament precursor wire up to, for example, about 30 mil, for a 100 filament count precursor wire. The single filament precursor wire need not be round because it is not subjected to subsequent twisting. For a precursor wire having more than one filament the wire is first twisted and then flattened without elongation. The remainder of the procedure of oxidizing, reacting and groove rolling is the same for a single or a multi-filament precursor wire. Sub-wire 90 is then coated with a relatively high resistance surface coating of $10^{-2}$ to $10^{-5}$ $\Omega$-cm. A plurality of sub-wires 90 are then planetary wound (FIG. 7) and heat treated to sinter the sub-wires together to form a multi-filament low-aspect ratio superconductor wire exhibiting low AC coupling losses between sub-wires. A plurality of wires are then planetary wound to form a cable.

Additions, subtractions and other modifications of the illustrated embodiments of the invention will be apparent to those practiced in the art and are within the scope of the following claims.

What is claimed is:

1. A method of making a multi-filament high temperature ceramic superconductor wire comprising the steps of:

producing a multi-filament precursor tape comprising filaments of superconducting metallic-alloy precursors in intimate contact with a noble metal matrix, the precursor tape and the filaments each having a generally rectangular cross section with a first side of the rectangle having a smaller dimension than that of a second side of the rectangle, oxidizing the filaments thereby transforming the filaments into precursor oxide filaments, reacting the precursor oxide filaments by thermal treatment thereby transforming the filaments into thermally treated precursor filaments for subsequent texturing, texturing the thermally treated precursor filaments by deforming the tape to a wire having a lower aspect ratio than said tape in a plane transverse to a longitudinal axis of said wire at least by reducing the larger dimension of the tape in such a way as to prevent buckling of the tape, the lower aspect ratio being preserved along a working length of said wire, and each said filament of said wire follows a longitudinal axis substantially parallel to said wire axis and has a lower aspect ratio than said thermally treated precursor filaments in a plane transverse to said longitudinal axis, the lower-aspect ratio of each said filaments being preserved along the working length of said wire, and reacting the textures wire thereby transforming the wire into a multi-filament high temperature ceramic superconductor wire.

2. The method of making a multi-filament superconductor wire of claim 1 wherein said step of producing a multi-filament precursor tape includes extruding a round multi-filament wire, twisting the round wire and hot rolling the round wire to a tape.

3. The method of claim 1 wherein the step of texturing results in the aspect ratio of each said filament being substantially equivalent to the aspect ratio of said wire.

4. A method of making a multi-filament high temperature ceramic superconductor wire comprising the steps of:

producing a multi-filament precursor tape comprising filaments of superconducting oxide precursors in intimate contact with a noble metal matrix, the precursor tape having a generally rectangular cross section with a first side of the rectangle having a smaller dimension than that of a second side of the rectangle, reacting the precursor oxide filaments by thermal treatment thereby transforming the filaments into thermally treated precursor filaments for subsequent texturing, texturing the thermally treated precursor filaments by deforming the tape to a wire having a lower aspect ratio than said tape in a plane transverse to a longitudinal axis of said wire at least by reducing the larger dimension of the tape in such a way as to prevent buckling of the tape, the lower aspect ratio being preserved along a working length of said wire, and each said filament of said wire follows a longitudinal axis substantially parallel to said wire axis and has a lower aspect ratio than said thermally treated precursor filaments in a plane transverse to said longitudinal axis, the low-aspect ratio of each said filament being preserved along the working length of said wire, and reacting the textured wire thereby transforming the wire into a multi-filament high temperature ceramic superconductor wire.

5. The method of making a multi-filament superconductor wire of claim 4 wherein said step of producing a multi-filament count precursor tape includes extruding a round multi-filament wire, twisting the round wire and deforming the round wire to a tape at room temperature.

6. The method of claim 5 wherein the step of deforming the round wire to the tape comprises subjecting the round wire to room temperature drawing.

7. The method of claim 5 wherein the step of deforming the round wire to the tape comprises subjecting the round wire to room temperature rolling.

8. The method of claim 4 wherein the step of texturing results in the aspect ratio of each said filament being substantially equivalent to the aspect ratio of said wire.

* * * * *